(12) United States Patent
Mallinson

(10) Patent No.: US 11,514,302 B2
(45) Date of Patent: Nov. 29, 2022

(54) PROGRAMMABLE IMPEDANCE

(71) Applicant: SiliconIntervention Inc., Kelowna (CA)

(72) Inventor: A. Martin Mallinson, Kelowna (CA)

(73) Assignee: SiliconIntervention Inc., Kelowna (CA)

( * ) Notice: Subject to any disclaimer, the term of this patent is extended or adjusted under 35 U.S.C. 154(b) by 0 days.

(21) Appl. No.: 16/806,264

(22) Filed: Mar. 2, 2020

(65) Prior Publication Data

US 2021/0133551 A1  May 6, 2021

Related U.S. Application Data

(60) Provisional application No. 62/813,121, filed on Mar. 3, 2019.

(51) Int. Cl.
*H03H 17/00* (2006.01)
*G06N 3/063* (2006.01)
*G06F 30/36* (2020.01)

(52) U.S. Cl.
CPC ........... *G06N 3/0635* (2013.01); *G06F 30/36* (2020.01); *H03H 17/0045* (2013.01)

(58) Field of Classification Search
CPC ... G06N 3/0635; G06F 30/36; H03H 17/0045
See application file for complete search history.

(56) References Cited

U.S. PATENT DOCUMENTS 3,590,366 A * 6/1971 Vaughn .................... H03H 7/24
  323/354
4,442,325 A * 4/1984 McDermott ............ H04M 1/76
  333/81 A (Continued)

OTHER PUBLICATIONS

Zheng Tang, O. Ishizuka and H. Matsumoto, "Backpropagation Learning in Analog T-Model Neural Network Hardware," Proceedings of 1993 International Conference on Neural Networks (IJCNN-93-Nagoya, Japan), Nagoya, Japan, 1993, pp. 899-902 vol. 1, doi: 10.1109/IJCNN.1993.714056.

(Continued)

*Primary Examiner* — Dinh T Le
(74) *Attorney, Agent, or Firm* — Gard & Kaslow LLP

(57) ABSTRACT

A programmable impedance element consists of a plurality of nominally identical two-port elements, each two-port element having an impedance element and two switches, the two-port elements arranged in a chain fashion with a structured set of switches such that a range of impedances can be obtained from each cell by dynamically changing the connections between the impedance elements in the cell. The common cell is constructed by connecting the nominally identical two-port impedance elements in a way that the number of possible combinations of the impedance elements is reduced to the subset of all possible combinations that uses the minimum possible number of connections. This structure allows the creation of matched impedances using industry standard devices. The connections between impedance elements are switches that may be "field-programmable," i.e., that may be set on the chip after manufacture and configured during operation of the circuit, or alternatively may be mask programmable.

8 Claims, 7 Drawing Sheets

(56) References Cited

U.S. PATENT DOCUMENTS

| | | | |
|---|---|---|---|
| 5,339,021 A * | 8/1994 | Thomson | H03H 7/24 |
| | | | 323/354 |
| 7,750,716 B2 * | 7/2010 | Hosoya | H03H 7/24 |
| | | | 327/308 |
| 9,098,663 B2 | 8/2015 | Mallinson | |
| 9,361,419 B2 | 6/2016 | Blair | |

OTHER PUBLICATIONS

Michihito Ueda, Ye Nishitani, Yukhiro Kaneko, Atsushi Omote, "Back-Propagation Operation for Analog Neural Network Hardware with Synapse Components Having Hysteresis Characteristics," PLoS One, Nov. 13, 2014, 9(11): e112659, doi:10.1371/journal.pone/0112659.

"Syntiant Brings Speech Interfaces to the Edge With New Ultra-Low-Power NDP100/NDP101 Neural Decision Processors," Barcelona, Spain, Feb. 25, 2019, ("https://www.syntiant.com").

Brian Bailey, "AI Architectures Must Change," Aug. 13, 2018, ("https://semiengineering.com/author/brian/").

Yihua Liao, "Neural Networks in Hardware: A Survey," ("http://bit.csc.lsu.edu/~jianhua/shiv2.pdf").

\* cited by examiner

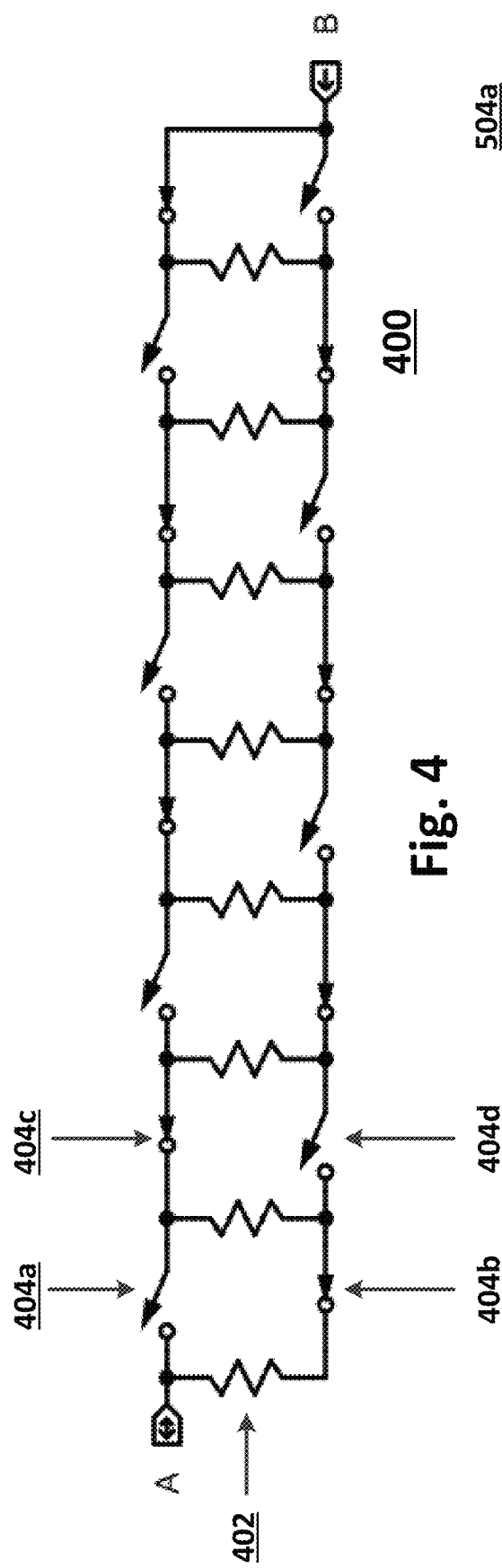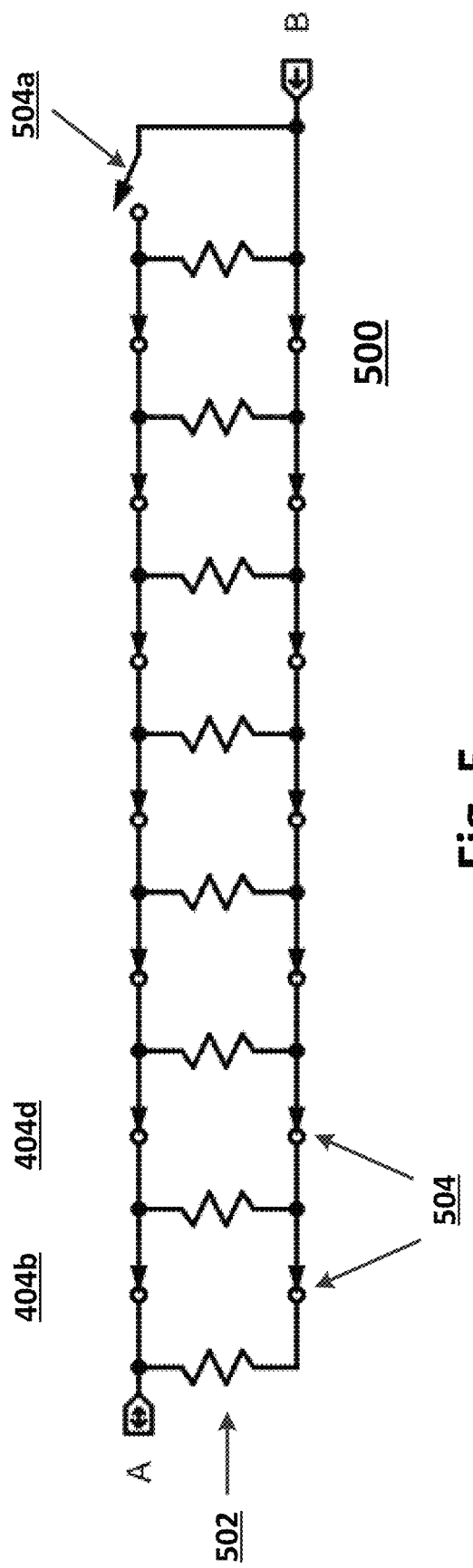

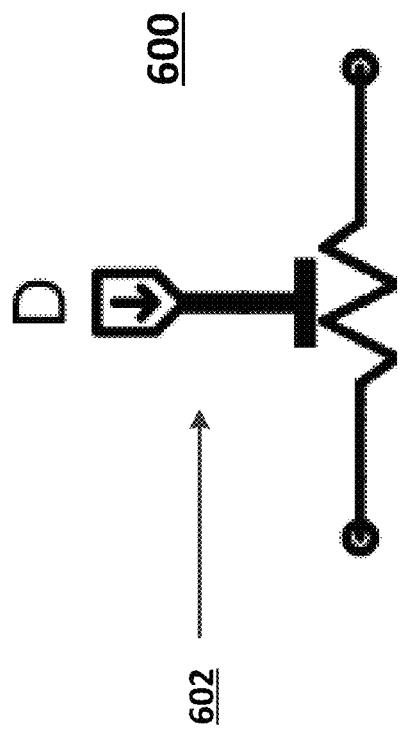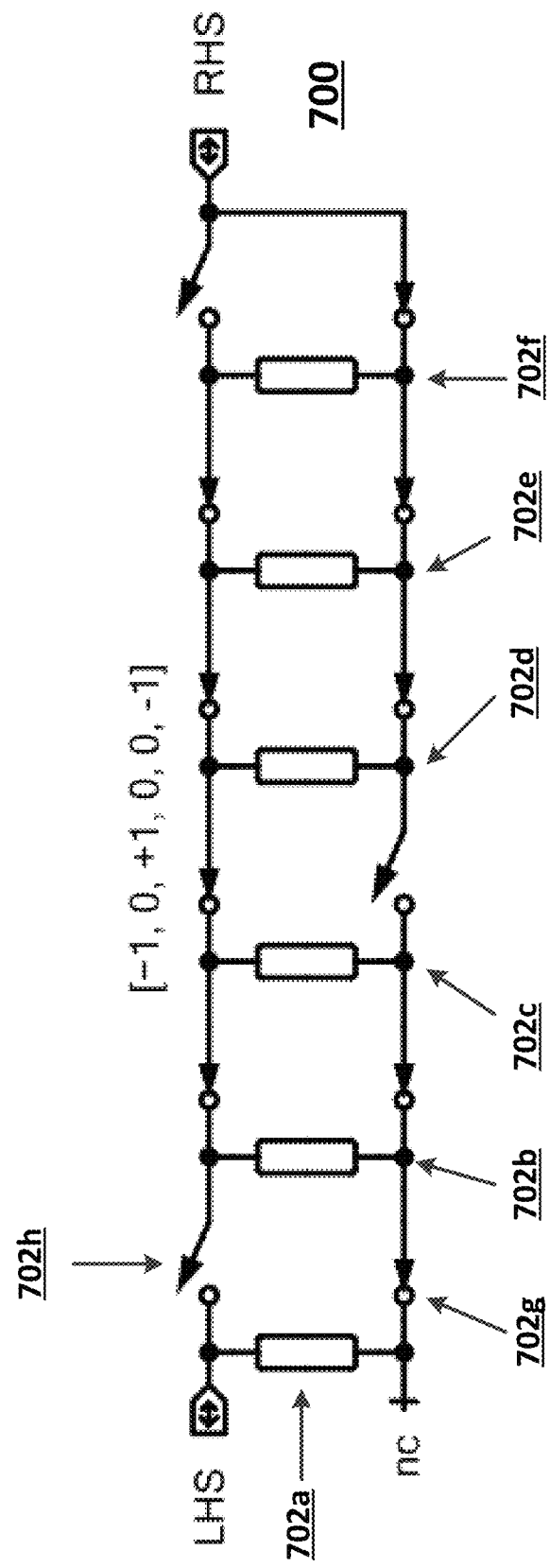

PROGRAMMABLE IMPEDANCE

This application claims priority from Provisional Application No. 62/813,121, filed Mar. 3, 2019, which is incorporated by reference herein in its entirety.

FIELD OF THE INVENTION

The present invention relates generally to analog integrated circuits, and more particularly to such circuits containing elements having impedance.

BACKGROUND OF THE INVENTION

As artificial intelligence (AI) becomes more prevalent and useful, designers look for better ways to implement the mathematical operations needed for the neural networks used in AI to function. In some cases, an AI network may be implemented in an analog computer, rather than a digital one. There are commercial reasons for this, as analog circuits are often capable of higher speed and lower power consumption than their digital equivalents.

As is known in the art, the common layer operation in a neural network is given by the equation:

$$Y_i = \sigma(A_{ij} \cdot X_j + C_i) \quad \text{(Equation 1)}$$

where $A_{ij}$ is a two-dimensional array and $X_j$ is a vector of input quantities (there is an implied summation of the repeated indices, summation over j in this case, i.e., Einstein notation). The activation function $\sigma$ is often, for example, the hyperbolic tangent function, and $C_i$ is the activation threshold.

One of the challenges to an analog implementation of the neural network is the multiply operation that is needed in each neuron of the layer, i.e., the multiplication of A*X in Equation 1 above. Further, each multiplication operation may require different weights of the input values. Such solutions as R-2R ladder networks, memristors and charge storage devices have been proposed to implement the multiply operation. None of these are ideal for various reasons.

For example, R-2R ladder networks and charge storage devices that operate in an analog fashion (i.e., that create a nominally continuous variation in channel conductance to a certain resolution) require a "probe current" to access the value; thus, in order to observe the channel conductance or R-2R ladder setting, a certain current must flow which develops a certain voltage, the resistive value then being the voltage divided by the current (V/I). Since a useful network constructed on these principles may have, for example, a million elements, even a small probe current of 100 nanoamps (nA) in each element potentially introduces 100 milliamps (mA) of overall current consumption.

The use of weights in an analog implementation of a neural network is particularly challenging, which tends to limit the applicability of analog circuits in AI. There are implementation techniques that allow for adaptable weights, such as capacitors, floating gate transistors, charge coupled devices (CCDs), and others. However, these techniques all suffer from various issues, for example, process-parameter variations across the chip during manufacture, limited storage times (i.e., volatility of information), and a lack of compatibility with standard very large scale integration (VLSI) processing technology.

Resistors easily represent weights, and have long been thought to be a possible solution to the adjustable weights needed in a neural network. For example, FIG. 1 is a diagram of what is known as a T-model analog neuron that was suggested as a unit in a T-model network over 20 years ago. As seen in FIG. 1, the T-model analog neuron relies upon variable resistors Ti1 to Tii-1 for the necessary adjustable weights.

However, resistors have not been adaptable after the production of the circuit chips containing them. Consequently, a chip fabricated with fixed elements (such as resistors) is only capable of executing one aspect of a more general AI solution, which has two phases. In a first phase, the AI network learns by various means that are well known to those of skill in the emerging art of AI methods. This is called "training." Once having learned, the AI network is presented with new data and applies the learned values to that new data. This second phase is called "inference."

Training requires that incremental adjustments be made to the elements of the network in search of a certain set of values that minimizes a specified error. During training, elements are constantly changed: fixed values are clearly incompatible with this process. However, once training is complete, the values are known and a device may be constructed with these fixed values. Thus, a fixed value device is generally capable of the second, inference phase.

However, a practical matter may prevent a fixed value network from performing even the second, inference phase; the required network may be so large that fabricating all of the fixed elements is simply impractical. A common solution for a very large system is to use "time-division multiplexing" (TDM); however, this solution is not possible with fixed weights, and thus again requires adjustable weights for the elements. In this situation, with TDM a subset of the complete AI inference machine is implemented in the limited resources: the weights of that subset are loaded into adjustable elements rather than fixed elements. The AI then executes a portion of the complete solution corresponding to the subset weights, storing its results into memory of some kind. The adjustable weights are then updated to represent a next small part of the compete AI, and the results of the first subset are applied from the memory; this is repeated until all of the weights have been used.

When such a time division multiplex of limited resources is employed, there will be many times when the weights are adjusted. For example, if the inference is run at 1 million operations per second and only $1/10^{th}$ of the complete machine is implementable, the weights will be changing 10 million times per second. It is known in the art that such a rapid change of programmable weights cannot be at low power, but rather a certain calculable power is dissipated just in the act of changing weights.

Adjustable weights offer a further advantage. If the AI inference machine is small enough to fit on the chip, then having adjustable weights is of huge commercial advantage: the weights are loaded into the adjustable elements only one time, at power up, and thereafter no power is dissipated changing the weights. There is no need to change the weights because the entire AI inference machine is represented by this set of weights on chip and no time division multiplexing is needed. Thus, one chip serves many tasks, and the programming is one time after manufacturing.

For at least these reasons, the use of variable resistors in analog computers has not been readably feasible. It would be desirable to have a simple way to manufacture variable impedance elements in analog integrated circuits without the disadvantages of the prior art solutions mentioned above.

Further, many other analog circuits also use devices having impedance, and there are thus undoubtedly other situations in which it would be desirable to be able to adjust the impedance of such elements during operation of the circuit.

SUMMARY OF THE INVENTION

The present application describes a simple circuit having a programmable impedance and a method of designing the same.

One embodiment describes a circuit element with programmable impedance, comprising: a first two-port element comprising: a uniform impedance element having two ends; a first switch connected to a first of the two ends of the uniform impedance element and having an open position and a closed position; a second switch connected to a second of the two ends of the uniform impedance element and having an open position and a closed position; a plurality of additional two-port elements, each additional two-port element nominally identical to the first two-port element, the two-port elements connected in a chain such that the first of the two ends of the uniform impedance element in each additional two-port element is connected to the switch connected to the second of the two ends of the uniform impedance element in the preceding two-port element and the second of the two ends of the uniform impedance element in each additional two-port element is connected to the switch connected to the first of the two ends of the uniform impedance element in the immediately preceding two-port element; an input port connected to the first two-port element configured to receive an input signal; an output port connected to the last two-port element configured to output the signal from the circuit element; and a control port configured to receive a control signal setting the switches of the first two-port element and the additional two-port elements into a selected configuration of open and closed positions.

Another embodiment describes a method of designing a circuit element with programmable impedance, comprising: selecting a number N of nominally identical two-port elements based upon a desired ratio of $N^2$ to 1 from the maximum to minimum impedance values of the circuit, each two-port element comprising a uniform impedance element having two ends, a first switch connected to a first of the two ends of the uniform impedance element and having an open position and a closed position, a second switch connected to a second of the two ends of the uniform impedance element and having an open position and a closed position, a plurality of additional two-port elements, each additional two-port element nominally identical to the first two-port element, the two-port elements connected in a chain such that the first of the two ends of the uniform impedance element in each additional two-port element is connected to the switch connected to the second of the two ends of the uniform impedance element in the preceding two-port element and the second of the two ends of the uniform impedance element in each additional two-port element is connected to the switch connected to the first of the two ends of the uniform impedance element in the immediately preceding two-port element, an input port connected to the first two-port element, an output port connected to the last two-port element and a control port configured to receive a control signal setting the switches of the first two-port element and the additional two-port elements into a selected configuration of open and closed positions; selecting a value for each uniform impedance element based upon the desired maximum and/or minimum impedance values of the circuit; determining all of the available impedance values possible with the N two-port elements of R impedance each and the switch positions corresponding to each available impedance value.

Still another embodiment describes a method of operating a circuit element with programmable impedance, the circuit element comprising a first two-port element comprising a uniform impedance element having two ends, a first switch connected to a first of the two ends of the uniform impedance element and having an open position and a closed position, a second switch connected to a second of the two ends of the uniform impedance element and having an open position and a closed position, a plurality of additional two-port elements, each additional two-port element nominally identical to the first two-port element, the two-port elements connected in a chain such that the first of the two ends of the uniform impedance element in each additional two-port element is connected to the switch connected to the second of the two ends of the uniform impedance element in the preceding two-port element and the second of the two ends of the uniform impedance element in each additional two-port element is connected to the switch connected to the first of the two ends of the uniform impedance element in the immediately preceding two-port element, an input port connected to the first two-port element, an output port connected to the last two-port element and a control port configured to receive a control signal setting the switches of the first two-port element and the additional two-port elements into a selected configuration of open and closed positions, the method comprising: applying to the control port a control signal setting the switches into a configuration causing the circuit element to have a selected impedance value; applying an input signal to the input port; and receiving an output signal from the output port. In still another embodiment, wherein applying to the control port a control signal further comprises: determining a desired impedance value of the circuit element; selecting an impedance value from a plurality of possible impedance values of the circuit element which is closest to the desired impedance value; and configuring the control signal to set the switches to the positions that cause the circuit element to have the selected impedance value.

BRIEF DESCRIPTION OF THE DRAWINGS

FIGS. 3 to 5 are diagrams of a common cell having a programmable impedance according to one embodiment.

FIG. 6 is a schematic representation of a common cell according to another embodiment.

FIG. 7 is a diagram of a common cell having a programmable impedance according to another embodiment.

DETAILED DESCRIPTION OF THE INVENTION

Described herein is a simple circuit having a programmable impedance and a method of designing the same. The approach described herein uses a "common cell" consisting of a plurality of nominally identical two-port elements, each two-port element having a uniform impedance element and two switches, the two-port elements arranged in a particular chain fashion with a structured set of switches such that a range of impedances can be obtained from each cell by dynamically changing the connections between the impedance elements in the cell. The common cell is constructed by connecting the nominally identical two-port elements in a way that the number of possible combinations of the impedance elements is reduced to the subset of all possible combinations that uses the minimum possible number of connections.

The resulting circuit according to the present approach allows the creation of matched impedances using industry standard devices. Further, the connections between impedance elements are switches that may be "field-programmable," i.e., that may be set on the chip after manufacture and configured during operation of the circuit, such as an analog computer, in which the impedance elements are contained, or alternatively may be mask programmable.

Figure 1:
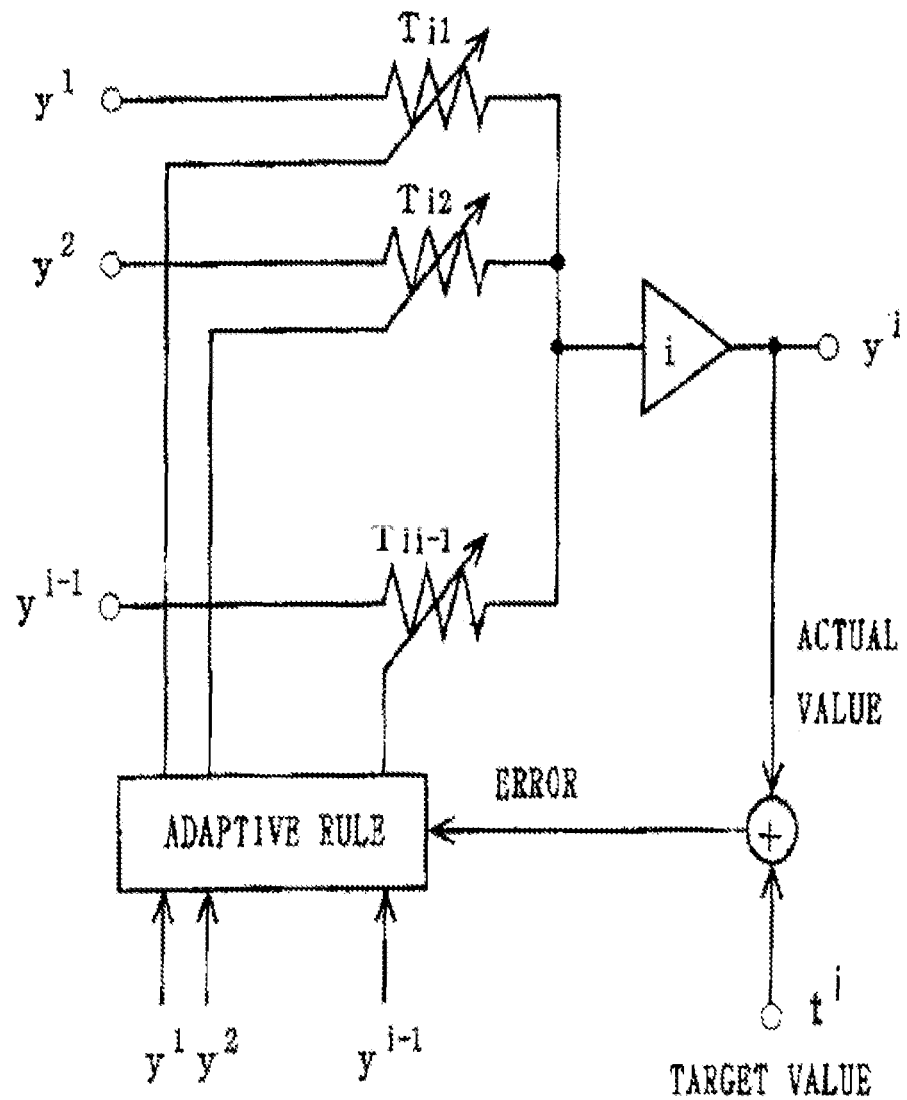
FIG. 1 is a diagram of a T-model analog neuron as is known in the prior art.
Figure 2:
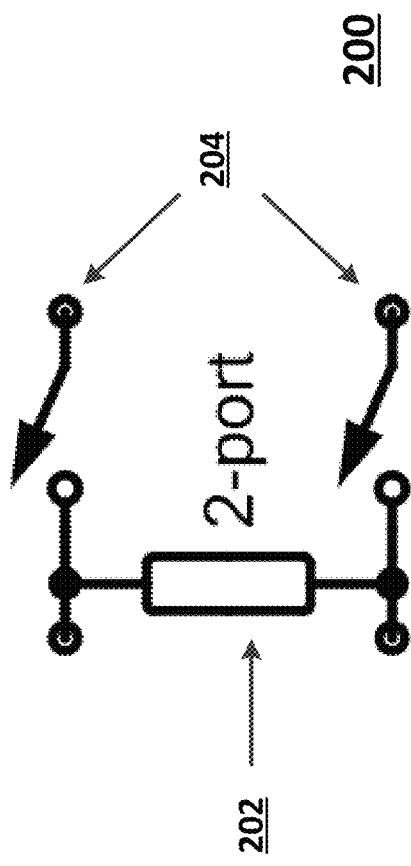
FIG. 2 is a diagram of a two-port element as is known in the prior art.

FIG. 2 is a diagram of a two-port element 200 as is known in the prior art and may be used in the present approach described herein. Two-port element 200 has an impedance element 202, and two switches 204, one switch 204 connected to one end of impedance element 202 and the other switch 204 connected to the other end of impedance element 202.

It is known that series and/or parallel arrangements of nominally identical two-port elements such as element 200 can be arranged to create an effective two-port element of adjustable impedance. See, for example, U.S. Pat. No. 9,361,419 ("the '419 patent"), in which a number of nominally equal two-port elements in a cell can be connected in a number of ways to achieve different impedances. As described therein, the approach of the '419 has certain advantages, such as allowance for process variances across multiple cells on a semiconductor chip, a large number of possible impedance values for each cell (given a large enough number of impedance elements), etc. For example, 16 two-port elements in a cell can be connected in different ways to obtain over 600,000 different impedance values.

However, the approach of the '419 patent also has certain limitations. In that approach, the configuration of the two-port elements within a block may only be selected once and then is "hard-wired," i.e., connected in a permanent manner so that it may not later be changed. Further, if the connection of the impedance elements is to be on the chip containing the cell, the approach of the '419 patent requires a determination of how the connections to each two-port element may be located outside of the cell on the chip, a process known as "place-and-route." (An alternative approach is to locate the connections of the two-port elements of a cell outside of the chip itself, but again the connections are to be hard-wired and thus are not changeable.)

It is possible to configure a number of nominally identical two-port elements, such as element 200 of FIG. 2, in a particular array to create a common cell that results in certain limitations on the number of possible combinations of the elements in the cell, such that only a subset of all of the possible combinations is available. The array is a chain of the two-port elements in which each two-port element can only be connected to the other elements in the chain in a particular way, so that the number of possible connections between the two-port elements is at its minimum. This approach allows one to thereby obtain some of the benefits of the approach of the '419 patent without the disadvantages of that prior approach.

Figure 3:
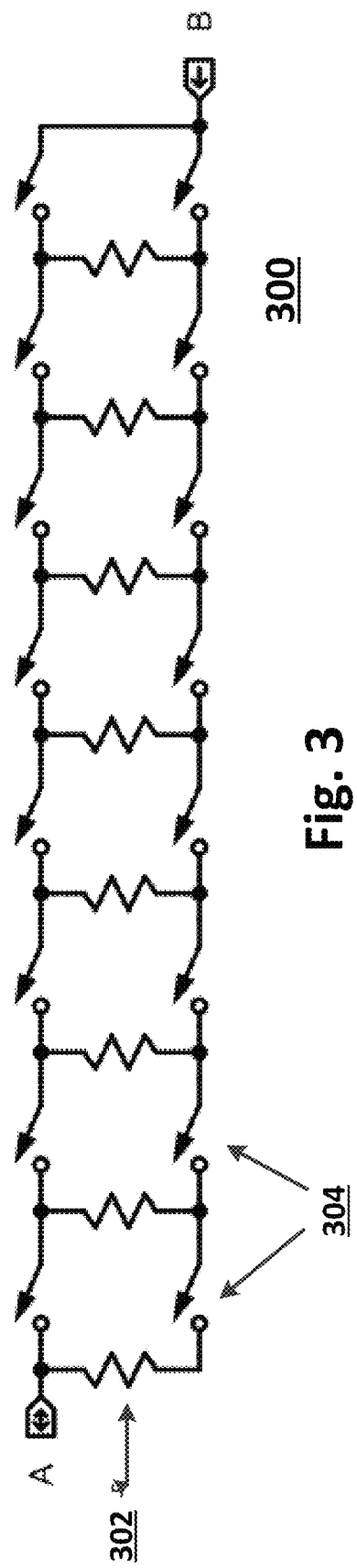

FIG. 3 shows such a common cell 300 comprising an array of two-port elements according to the present approach in which each impedance element 202 is now a resistor 302. As illustrated, common cell 300 contains eight resistors 302, and 16 switches 304. The resistors 302 are assumed to be of the same uniform value, and the switches 304 are capable of being opened and closed by digital means after construction of the chip.

In FIG. 3, all of the switches 304 are illustrated as open, and thus array 300 in FIG. 3 is an open circuit and has a resistance (and thus an impedance) that is effectively infinite. (Note that opening both switches 204 in FIG. 2 will isolate element 200 from a next element; thus, opening any two switches 304 associated with the same impedance element 302 will also result in an open circuit and infinite impedance.)

Note that while resistors are used in this and the following Figures, the present approach is not limited to resistors as impedance elements. For example, on advanced chips the physical size of a field-effect transistor (FET) that is connected and operating in its resistive region may be far smaller than a resistor of equal impedance. Thus, where the Figures herein show resistors, one of skill in the art will appreciate that a FET or any other impedance element having nominally linear resistance may be substituted as long as all of the elements are of a uniform impedance. For example, in addition to a resistor or FET, the repeated impedance element may be an inductor, capacitor, memristor, or a complex device biased to represent these linear elements over a certain range of conditions, such as a diode, varactor or coupled inductor.

FIG. 4 shows a common cell 400 that is like common cell 300 of FIG. 3 except for the configuration of the switches. In common cell 400, the upper switch 404a after the first resistor 402 is open, and the lower switch 404b after the first resistor 402 is closed. Conversely, upper switch 404c after the second resistor 402 is closed while lower switch 404d after the second resistor 402 is open. Thus, it will be apparent that a current from input port A must flow the first resistor 402 of common cell 400 and then through the second resistor 402, and the resistors are thus in series. The switches in common cell 400 alternate in this fashion, so that a current must flow through all eight resistors 402 in common cell 400, i.e., all of the resistors 402 are in series. If each resistor has a value R, the total resistance of common cell 400 is 8R, since there are eight resistors. As would be understood by one of skill in the art, this is the maximum resistance available from a common cell having eight resistors.

FIG. 5 shows a common cell 500 that is again like common cells 300 and 400 of FIGS. 3 and 4, respectively, except for the configuration of the switches. In common cell 500, all of the switches 504 are closed, except for the last upper switch 504a. As a result, any current is divided among all of the resistors 502, i.e., the resistors 502 are in parallel, and common cell 500 thus has an effective resistance of R/8. Again, as would be understood by one of skill in the art, this is the minimum resistance available from an array having eight resistors. (If switch 504A in common cell 500 is closed, the result is that there is effectively no resistance between points A and B, and common cell 500 will be a short circuit.)

Thus, ignoring the effectively infinite resistance of an open circuit or the effectively zero resistance of the short circuit (which are of little interest in many applications and attainable in simpler ways than the present approach), a common cell such as that illustrated in FIGS. 3 to 5 can have a resistance of between 8R and R/8, where again R is the resistance of each resistor, depending upon how the switches are configured, and thus how the resistors are connected in series and/or parallel. This is an effective range of 64 to 1 between the maximum and minimum resistances of the array.

As will be apparent to one of skill in the art, the resistance R of each resistor can be adjusted to obtain desired absolute values of the maximum and/or minimum relative values 8R and R/8. One of skill in the art will also appreciate that an array constructed in this fashion need not contain resistors, but rather may use any impedance elements. Further, such an array need not have only 8 resistors or other impedance elements; any number of two-port elements may be added as needed to obtain a greater range than 64 to 1 if desired.

FIG. 6 shows a schematic representation of a common cell 600 such as that shown in FIGS. 3 to 5. An entire common cell is here represented as a resistor; the value of the illustrated resistor will be the resistance of the common cell, which as above depends upon the selected position of the switches in the common cell. A control signal D enters on a bus 602 to control the position of the switches in the common cell, and thus determine the impedance of the common cell.

FIG. 7 is a diagram of another common cell 700 having a programmable impedance according to one embodiment, which illustrates how the control signal D in FIG. 6 might operate. In this example, common cell 700 has 6 impedance elements 702a to 702f.

A mapping is established by using a number to represent the switch positions of each two-port impedance element in the common cell. For example, for a given impedance element one might use a 1 to indicate that the "upper" switch, such as switch 404a in FIG. 4, is closed, a −1 to indicate that the "lower" switch, such as switch 404b in FIG. 4, is open, and a 0 to indicate that both switches are closed. (As above, if both switches of a given two-port element are open, the common cell is an open circuit.) A list of these numbers may then be used to indicate how the elements in the common cell are connected.

In FIG. 7, it may be seen that the second and third impedance elements 702b and 702c are in parallel with each other, resulting in an impedance for those elements of 0.5*R, and the last three impedance elements 702d, 702e and 702f are in parallel with each other, resulting in an impedance for those elements of 0.3333*R. Both of those combinations are in series with each other and with impedance element 702a. If each impedance element has an impedance R, then the total impedance is R+R/2+R/3=1.833 R.

As illustrated in FIG. 7, the lower switch 702g of impedance element 702a is closed, while the upper switch 702h of element 702a is open. Thus, per the mapping described above, the switch position of impedance element 702a is represented by a −1. Both of the switches associated with each of impedance elements 702b, 702d and 702e are closed, so those switch positions are each represented by a 0. The upper switch associated with impedance element 702c is closed while the lower switch is open, resulting in a 1 for impedance element 702c. Impedance element 702f has the upper switch open and the lower switch closed, like impedance element 702a, so that is again represented by a −1. Thus, using the mapping nomenclature of 1, 0 and −1 as above in order for the six impedance elements 702a to 702f, the switch positions of common cell 700 may be represented by the string:

[−1, 0, 1, 0, 0, −1]

One method of digitally encoding a control signal as in FIG. 6 is to use two bits to represent each element of this string (since there are 3 possible values for each one), and thus a string of 12 bits is to be input to a common cell having six impedance elements as a control signal D.

So that an impedance value close to a particular desired value may be obtained from a common cell, all of the possible combinations of the impedance elements in the common cell should be known. While it is possible to do this manually, it will be apparent that more impedance elements in the common cell will result in a rapidly growing number of possible values. It is easy to do this with the assistance of a computer; for example, attached as the Appendix hereto is an example of LISP code for generating all of the possible values of the overall impedance of a common cell, corresponding to all possible switch configurations for any given number of impedance elements.

In practice, the equivalent of the example LISP code can be embedded in a controller on the chip or in the system containing the common cell, or alternatively all of the possible impedance values can be calculated and then the values, and the associated switch positions, stored in a table on the chip or in the system. Once a desired impedance value for a specific common cell is input, the closest available impedance of the common cell may be selected and the switches of the impedance elements placed in the positions corresponding to that closest available common cell impedance.

In the case of common cell 700, given the six impedance elements there are 26 possible values of overall impedance. If each impedance element has a nominal impedance of 1, as above these values range from 1/6 to 6, a ratio of 1 to 36, ranging as follows:

| |
|---|
| 0.167 |
| 0.2 |
| 0.25 |
| 0.333 |
| 0.5 |
| 0.667 |
| 0.75 |
| 0.833 |
| 1.0 |
| 1.2 |
| 1.25 |
| 1.333 |
| 1.5 |
| 1.833 |
| 2.0 |
| 2.25 |
| 2.333 |
| 2.333 |
| 2.5 |
| 3.0 |
| 3.333 |
| 3.5 |
| 4.0 |
| 4.5 |
| 5.0 |
| 6.0 |

(In this instance, there are two different configurations yielding an impedance value of 2.333; however, this is not necessarily the case for other numbers of impedance elements.)

Figure 8:
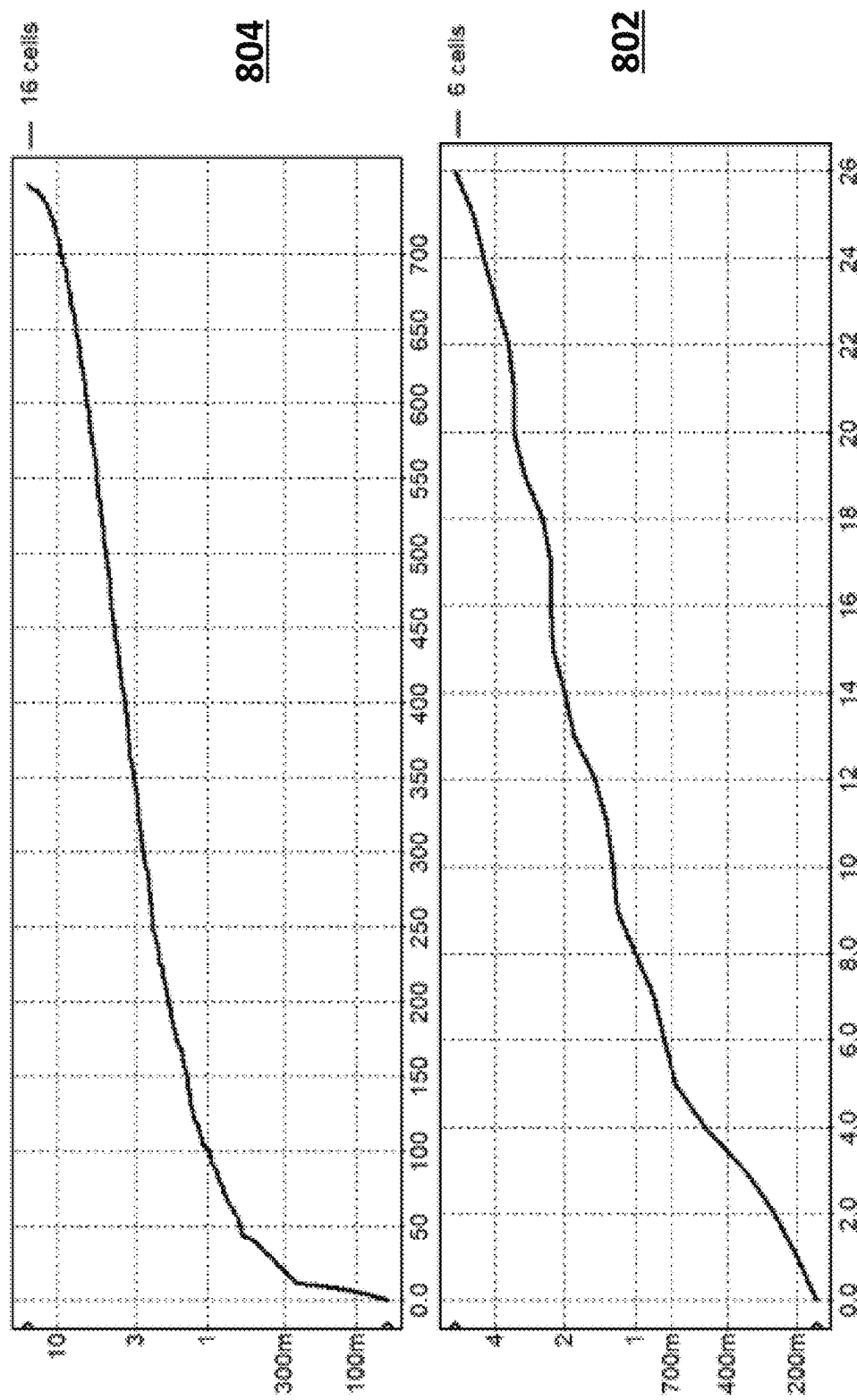
FIG. 8 shows a graph of the values for a six impedance element common cell, and a graph of the values for a 16 impedance element common cell.

FIG. 8 shows a graph 802 of the 26 values for a six impedance element common cell, and a graph 804 of the approximately 800 values for a 16 impedance element common cell. The Y-axis on each graph is logarithmic, and it will be seen that in both cases the resulting curve of possible values is also generally logarithmic, being smoother for graph 804 with more values from a common cell with a greater number of impedance elements. It is believed that a logarithmic distribution of available weights in an AI system is advantageous.

Note that the number of possible values for a common cell having 16 impedance elements using the present approach is much less than the approximately 650,000 possible values for a cell with 16 two-port elements in the approach of the '419 patent. This is because the '419 patent allows the 32 available ports to be connected in any way, while in the present approach how the two ports of each element connect to elements up or down the chain is limited by how the other elements are interconnected. As above, in the present approach, the connections between elements, i.e., the switches, are field programmable, unlike those in the '419 patent. Further, the positions of the connections between two-port elements in the present approach is fixed by the chain configuration of two-port elements, and thus no place and route process is needed as was the case in the '419 patent.

Figure 9:
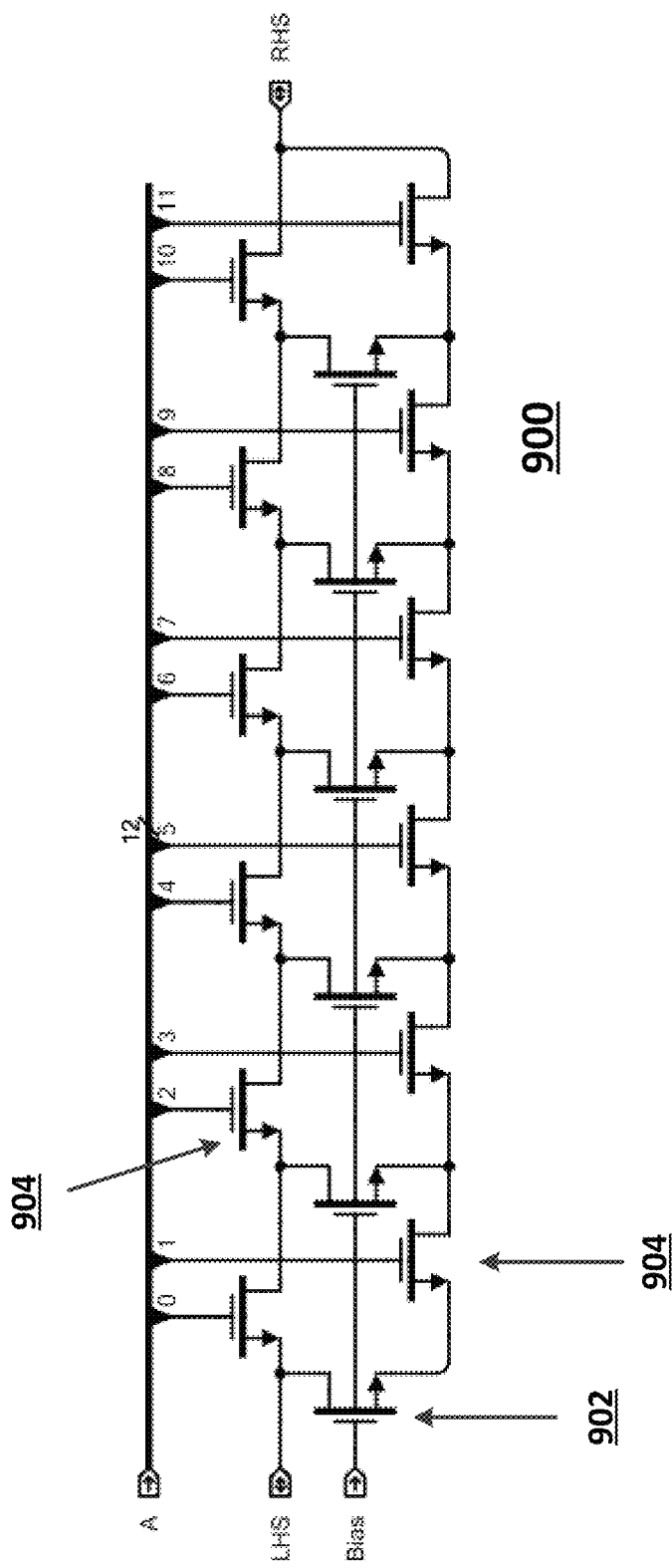
FIG. 9 is a schematic diagram of a common cell according to another embodiment.

FIG. 9 is a schematic diagram of a common cell 900 according to another embodiment in which FETs are used as the impedance elements. As above, a FET has nominally linear resistance in a resistive region and thus may be substituted for the resistors shown and described herein; one advantage of doing so is that the physical size of a FET may be far smaller than a resistor of equal impedance.

In common cell 900, the FETs having gates connected to the signal Bias, such as FET 902, are the impedance elements; they are preferably long, narrow devices operating in their resistive region. The FETs 904 having gates connected to the bus A are the switches; these are preferably short devices with low resistance between the drain and source when operating ("on-resistance").

Figure 10:
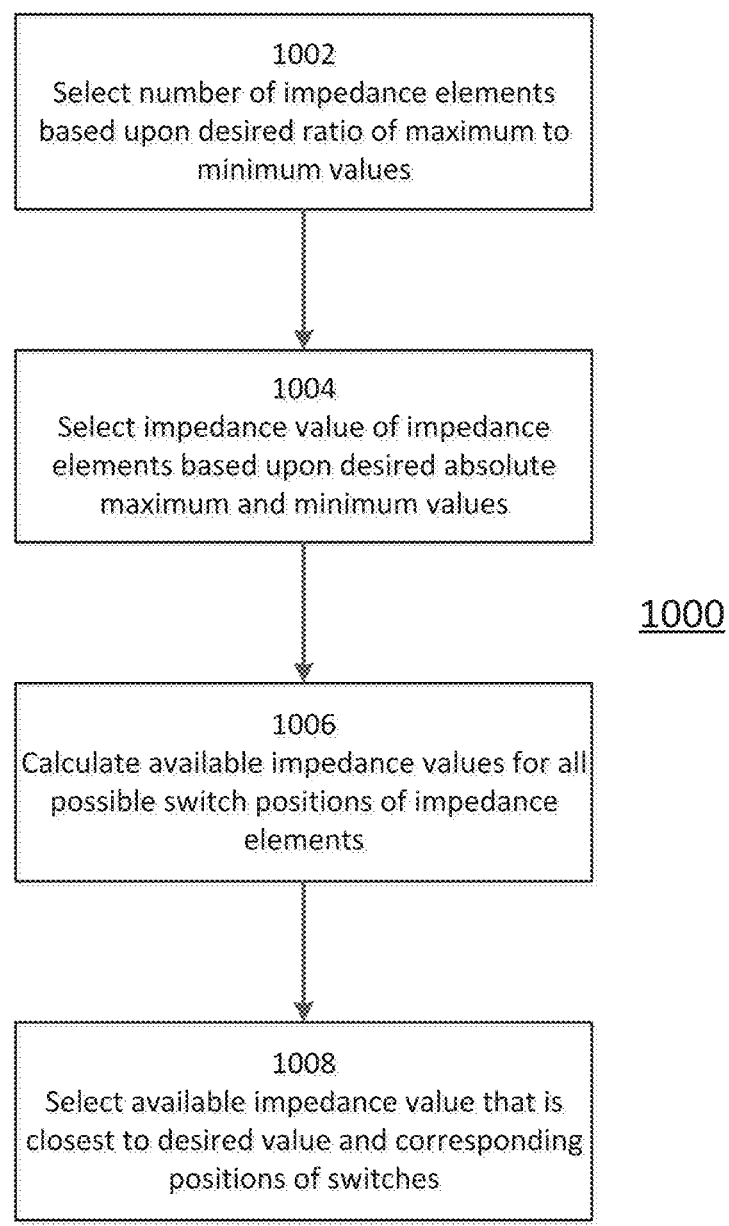
FIG. 10 is a flowchart of a method of selecting values for a plurality of programmable impedances according to one embodiment.

FIG. 10 is a flowchart of a method of selecting values for a plurality of programmable impedances according to one embodiment.

At step 1002, the number N of nominally identical two-port elements to be included in each common cell is selected based upon the desired ratio of the maximum to minimum values of each common cell. The ratio will always be from N to 1/N, i.e. a range of $N^2$, as seen above in FIGS. 3 (8 elements, a 64 to 1 ratio) and 7 (6 elements, a 36 to 1 ratio).

At step 1004, the impedance value of the impedance elements in the two-port elements is selected based upon the desired maximum and minimum values of impedance that are desired in the circuit or system. As discussed above with respect to FIG. 7, if there are N elements from step 1002, and the value selected for each of the impedance elements is R, then the range of available impedance values for each of the common cells will be N*R to R/N.

At step 1006, all of the impedance values that are available in each common cell based upon the values of N and R from steps 1002 and 1004 are calculated. As above, this may be done by a controller during operation of the circuit or system containing the common cells, or may be done prior to such operation and the results stored on the chip or in the system as a table of available values with the corresponding switch positions for each value.

Based upon the design of the circuit or system in which the common cells are to be used, there will be a desired impedance value for each common cell. For example, in an AI system using impedance elements for signal weights, each such impedance element will have a desired value that reflects a desired signal weight.

At step 1008, for each common cell used as an impedance element, an impedance value is selected that is the one of the available values that is closest to the desired value for that impedance element. The selected impedance value will have a corresponding pattern of how the switches in the common cell are to be set so that the common cell will have the selected impedance value. The switch pattern may then be implemented when the circuit or system is in operation, so that the common cell provides the selected impedance value. An input signal is then applied to the first two-port element of the common cell and an output signal is received from the last two-port element of the common cell as described above.

By combining these features, it is possible to construct a programmable and variable impedance element. One of skill in the art will appreciate that programmable and variable impedance with any number of distinct values may be constructed according to these principles.

The disclosed system has been explained above with reference to several embodiments. Other embodiments will be apparent to those skilled in the art in light of this disclosure. Certain aspects of the described method and apparatus may readily be implemented using configurations other than those described in the embodiments above, or in conjunction with elements other than or in addition to those described above.

For example, as is well understood by those of skill in the art, various choices will be apparent to those of skill in the art. Further, the illustration of transistors and resistors is exemplary; one of skill in the art will be able to select the appropriate number of resistors, transistors and/or similar elements that is appropriate for a particular application.

These and other variations upon the embodiments are intended to be covered by the present disclosure, which is limited only by the appended claims.

What is claimed is:

1. A circuit element with programmable impedance, comprising:
   a first two-port element comprising:
      a uniform impedance element having two ends and an impedance value;
      a first switch connected to a first of the two ends of the uniform impedance element and having an open position and a closed position;
      a second switch connected to a second of the two ends of the uniform impedance element and having an open position and a closed position;
   a plurality of additional two-port elements, each additional two-port element nominally identical to the first two-port element, wherein the uniform impedance element in each additional two-port element has the same impedance value as the uniform impedance element in the first two-port element;
   wherein the first two-port element and the plurality of additional two-port elements are connected in a chain such that:
      the first of the two ends of the uniform impedance element in each additional two-port element is connected to the first switch connected to the first of the two ends of the uniform impedance element in a preceding two-port element; and
      the second of the two ends of the uniform impedance element in each additional two-port element is connected to the second switch connected to the second of the two ends of the uniform impedance element in an immediately preceding two-port element;

an input port connected to the first two-port element configured to receive an input signal;

an output port connected to a last two-port element configured to output the signal from the circuit element; and a control port configured to receive a control signal setting the switches of the first two-port element and the additional two-port elements into a selected configuration of the open and closed positions of the switches.

2. The circuit element of claim 1 wherein the uniform impedance elements are resistors.

3. The circuit element of claim 1 wherein the uniform impedance elements are field-effect transistors.

4. The circuit element of claim 1 wherein the uniform impedance elements are capacitors.

5. The circuit element of claim 1 wherein the uniform impedance elements are memristors.

6. The circuit element of claim 1 wherein the uniform impedance elements are diodes.

7. The circuit element of claim 6 wherein the diodes are veractor diodes.

8. The circuit element of claim 1 wherein the uniform impedance elements are coupled inductors.

* * * * *